United States Patent [19]

Wang

[11] 4,241,128
[45] Dec. 23, 1980

[54] PRODUCTION OF PIEZOELECTRIC PVDF FILMS

[75] Inventor: Tsuey T. Wang, Stirling, N.J.

[73] Assignee: Bell Telephone Laboratories, Incorporated, Murray Hill, N.J.

[21] Appl. No.: 22,187

[22] Filed: Mar. 20, 1979

[51] Int. Cl.³ .................... B29C 25/00; H01L 41/22
[52] U.S. Cl. ................... 428/212; 264/22; 428/421; 428/910; 526/255
[58] Field of Search ............... 264/22, 24, 27, 235.6, 264/288.4, 289.6, 290.2, 210.7; 526/255; 427/100; 428/421, 212, 910; 310/357, 800

[56] References Cited

U.S. PATENT DOCUMENTS

| | | | |
|---|---|---|---|
| 3,691,264 | 9/1972 | Osakima | 264/22 |
| 3,707,592 | 12/1972 | Ishii et al. | 428/421 |
| 3,878,274 | 4/1975 | Murayama | 264/24 |
| 3,931,446 | 1/1976 | Murayama | 427/100 |

OTHER PUBLICATIONS

"Orientation of Crystalline Dipoled in Poly(Vinylidene Fluoride) Films under Electric Field", D. Naegele et al., Appl. Phys. Lett. 33(2), pp. 132-134 (1978).
"Piezoelectricity and Pyroelectricity in Crystalline Polymer", G. T. Davis et al., National Bureau of Standards Internal Report, 76-1186 (1976).
"A Study on Orientation Effects in Polyethylene in the Light of Crystalline Texture", (Part I), I. L. Hay et al., Journal of Materials Sci., 1, pp. 41-51 (1966).
"Piezoelectricity, Pyroelectricity, and The Electrostriction Constant of Poly (Vinylidene Fluoride)", K. Nakumura et al., J. Polymer Sci., Part A-2, vol. 9, pp. 161-173 (1971).
"Electric-Field-Induced Phase Changer in Poly(Vinylidene Fluoride)", G. T. Davis et al., J. Appl. Phys., 49(10), pp. 4998-5002 (1978).
"Nuclear Magnetic Resonance & X-ray Determination of the Structure of Poly(Vinylidene Fluoride)", J. B. Lando et al., J. Polymer Sci., Part A-1, vol. 4, pp. 941-951 (1966).
"Ferroelectricity in Polyvinylidene Fluoride", R. G. Kepler et al., S. Apply. Phys. 49(3), pp. 1232-1235 (1978).

Primary Examiner—James B. Lowe
Attorney, Agent, or Firm—Peter V. D. Wilde

[57] ABSTRACT

A method of producing piezoelectric and pyroelectric polyvinylidene fluoride (PVDF) films is shown. A stretched PVDF film having a predominantly $\beta$-type crystal structure is rolled for thickness reduction. The rolling orients a substantial percentage of b axes of $\beta$ crystals normal to the film surface, as determined by X-ray diffraction patterns. An optional annealing step is shown, wherein the rolled film is heated, optionally while under pressure. Improvement in the piezoelectric constant of 25 percent or more is typical.

9 Claims, 5 Drawing Figures

Z DIFFRACTION PATTERN:
STRETCHED FILM

Z DIFFRACTION PATTERN:
STRETCHED, ROLLED FILM

PRODUCTION OF PIEZOELECTRIC PVDF FILMS

BACKGROUND OF THE INVENTION

1. Field of the Invention

This invention relates to a method for making polyvinylidene fluoride (PVDF) films having an enhanced piezoelectric constant. More particularly, the invention encompasses rolling a PVDF film that has previously been stretched in order to obtain a preferred crystalline orientation.

2. Description of the Prior Art

In the prior art, polarized PVDF films are known to have a relatively high piezoelectric constant. This makes polarized PVDF films suitable for use as electromechanical transducers. These include microphones, pressure gauges, pressure activated switches, etc., as well as transducers employing the inverse piezoelectric effect, such as speakers, etc. Polarized PVDF films also have a relatively large pyroelectric constant, and they can be used to frequency-double laser light.

In order to enhance the piezoelectric constant, the prior art teaches the use of mechanical deformation techniques. In particular, U.S. Pat. No. 3,931,446 discloses a technique whereby a PVDF film having a predominantly α-type crystal structure is stretched in order to obtain a film having a predominantly β-type crystal structure. That technique, preferentially accomplished at an elevated temperature, increases the piezoelectric constant over unstretched films after the film is poled in an electric field. It is also known that rolling a film may increase the percentage of the β-type crystal structure in the film; see "Piezoelectricity, Pyroelectricity, and the Electrostriction Constant of Poly(vinylidene Fluoride)," K. Nakamura et al, *Journal of Polymer Science*, Part A-2, Vol. 9, pp. 161–173 (1971). However, the rolling technique is limited to a film elongation ratio of about 2, which is less than can be achieved by the stretching technique, implying a greater percentage of β crystal structure in highly stretched films, and a higher piezoelectric constant.

A conversion from α-type to β-type structure can also be accomplished in PVDF films by poling in a high electric field; see "Electric-field-induced Phase Changes in Poly(vinylidene fluoride)," G. T. Davis et at, *Journal of Applied Physics*, 49 (10), pp. 4998–5002 (1978).

It is also known in the prior art that PVDF films are more readily polarized by poling in an electric field at elevated temperatures. Furthermore, it is generally known thermodynamically that an increase in the piezoelectric constant is often accompanied by an increase in the pyroelectric constant.

It is generally the objective of this invention to further improve the piezoelectric, inverse piezoelectric, and pyroelectric effects in PVDF films, for use in a wide variety of devices.

SUMMARY OF THE INVENTION

I have invented a new technique for increasing the piezoelectric and pyroelectric constants in PVDF films.

This technique comprises rolling a PVDF film that has been previously stretched, as by prior art stretching techniques. As in the prior art, the stretching included herein converts the predominantly α-type crystal structure into a predominantly β-type crystal structure. The rolling step included in the inventive method comprises passing the film one or more times through a roller to achieve a thickness reduction. The film may be further processed after rolling by annealing at an elevated temperature, which causes a further increase in the piezoelectric constant of the film after it is poled.

After the rolling step, or after the rolling and annealing steps, the film is poled in an electric field, preferably at an elevated temperature, as in the prior art. By processing films according to the inventive method, increases of piezoelectric constant averaging about 25 percent have been obtained, compared to films prepared in the conventional manner by stretching without rolling The films produced in the inventive manner have been shown by wide-angle X-ray diffraction patterns to have a high proportion of the crystallographic b axes of the unit cells pointing substantially normally to the surface of the film. This is in contrast to conventionally prepared film, which has a substantially random distribution of directions of the crystal b axes in a plane normal to the stretch direction of the film.

DETAILED DESCRIPTION

The following description covers a method for making polarized polyvinylidene fluoride (PVDF) films having enhanced piezoelectric and pyroelectric constants. As used herein, the term "piezoelectric" also includes the inverse piezoelectric effect.

Figure 1:
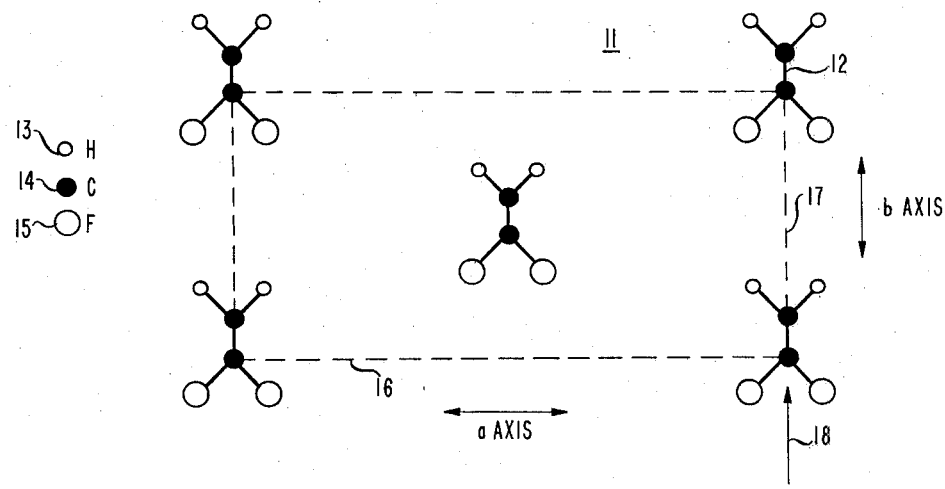
FIG. 1 shows as PVDF β-type crystal unit cell.

Shown in FIG. 1 is a PVDF unit cell 11 of the β type, also frequently referred to as polar form I. The electric dipole 18 resulting from the ($CH_2$–$CF_2$) units points in a direction parallel to the crystallographic b axis 17. In the α-type unit cell (not shown), frequently also referred to as antipolar form II, the net dipole moments of adjacent ($CH_2$–$CF_2$) units point in different directions. Thus, the net dipole moment of the α-type crystal is low. Also, the piezoelectric constant for films having a predominantly α-type structure is low as compared to films having a predominantly β-type crystalline structure.

Figure 2:
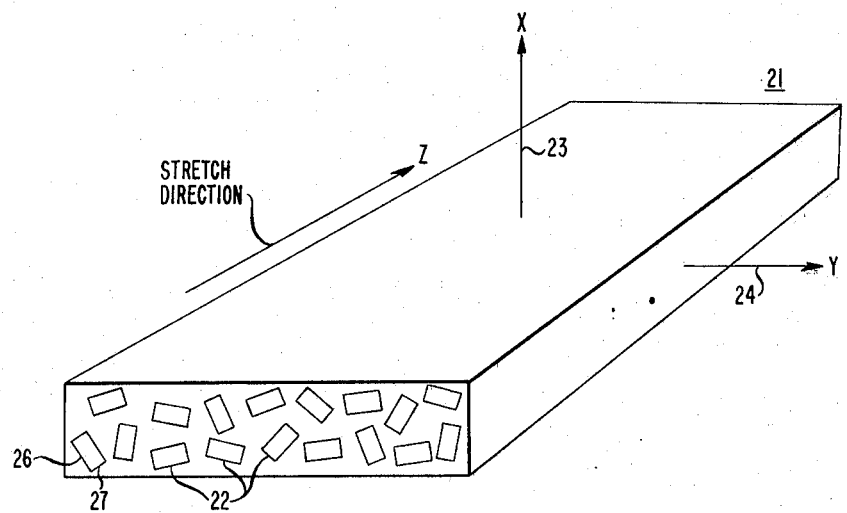
FIG. 2 shows PVDF crystal orientations in a stretched film prior to rolling.

A conversion from the α-type to the β-type film can be accomplished by various prior art methods noted above. However, for the prior art rolling or stretching techniques, the crystal b axes 17 are oriented substantially randomly in planes normal to the stretch direction of the film prior to poling. Thus, the electric dipoles are substantially randomly oriented. This is illustrated schematically in FIG. 2 for stretched film 21, wherein various crystallites 22 are seen in cross section, having their b axes such as 27 randomly oriented. The c axes (not shown) of these crystals align preferentially along the z axis of the film. The prior stretching of the film along the z axis resulted in both a transformation of the α-type structure to the β-type structure, and the aforesaid uniaxial alignment of the c axes.

Figure 3:
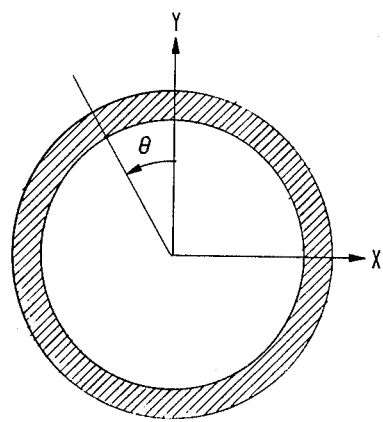
FIG. 3 shows schematically a wide-angle X-ray diffraction pattern with the X-ray beam along the z-axis for a stretched PVDF film.

Wide-angle X-ray diffraction patterns taken by a beam along the z axis confirm that the b axes are substantially randomly oriented; see FIG. 3, showing a pattern as a function of angle θ for PVDF films that have been stretched as by prior art techniques.

It has been discovered that the crystals in conventionally stretched PVDF film can be further oriented by rolling so that a large proportion of the b axes point substantially normally to the film surface. This results in improvements in the piezoelectric ($d_{13}$) constant over what can be obtained with conventionally stretched film. As used herein, the subscripts 1, 2, 3 correspond to the x-, y-, z- axes, respectively, as defined in FIG. 2.

In particular, it has been found that if PVDF films are stretched as by conventional methods to at least 3 times their original length, a further improvement in piezoelectric constant after poling of typically 20 percent or more can be achieved by rolling. The rolling should obtain a thickness reduction of at least 15 percent to obtain the maximum increase in the piezoelectric ($d_{13}$) constant. The rolling is preferentially accomplished by multiple passes through the rolling means to prevent excessive wrinkling of the film. The maximum reduction in film thickness for the Examples given below has typically been approximately 35 percent below the original thickness. This is limited by cracking of the film for greater reductions for these Examples.

A further improvement in $d_{13}$ can be obtained by annealing the rolled film prior to poling. The annealing is accomplished by heating the rolled film to at least 70 degrees C. The heating may be accomplished while applying to the film a pressure of at least one million Newtons/mtr$^2$ (1 MPa) and typically 20 MPa in order to remove wrinkles. The resulting improvement in $d_{13}$ after poling is typically about 5 percent as compared to the unannealed stretch-rolled films, yielding typically a total improvement in $d_{13}$ of 25 percent or more by the inventive method. To some extent, the annealing can substitute for rolling, in that lightly rolled films (i.e., small thickness reduction) are improved more by annealing than more heavily rolled films are improved by annealing. However, the greatest overall improvement is generally obtained in the more heavily rolled films.

Typical procedures of the inventive method will be illustrated by means of the following Examples.

EXAMPLE 1

The starting material was a commercial PVDF resin obtained from Pennwalt Corporation (Kynar 821). It had a molecular weight $\bar{M}_w = 404,300$ ($\bar{M}_w/\bar{M}_n = 1.87$) and a concentration of head-to-head units of 5.6 percent as determined from $^{19}$F NMR.

Sheets of different thicknesses (0.1 to 1.5 mm) were compression molded in a press at 220 degrees C. using spacers of appropriate thicknesses and quenched to room temperature at a rate of about 50 degrees C./min. Each sheet (ca. 10 cm × 10 cm in area) was stretched in an Instron at 70 degrees C. under an initial strain rate of 10 percent per minute to about seven times its original length, then allowed to relax in the stretched state for 30 minutes at 120 degrees C. It was then cooled to room temperature over a two-hour period. This first annealing step is a prior art process.

Pieces about 2 cm wide and 6 cm long were cut from the stretched film and rolled with a pair of steel rollers (diameter 9 cm, roller speed about 20 rpm) along the stretched direction in several steps until a desired reduction in thickness was obtained. Rolling was accomplished at temperatures ranging from 20 degrees C. to 100 degrees C., with a wider range being possible. Rolling caused an increase in the width but a slight decrease in the length, the amounts of which depended on the degree of thickness reduction (e.g., the width increased by about 50 percent and the length decreased by about 9 percent when the thickness was reduced by about 30 percent). After the rolling process, the films were annealed as part of the inventive process at elevated temperatures (100 to 160 degrees C.) for varying lengths of time. The annealing was also accomplished under a light pressure (ca. 20 MPa) in order to remove wrinkles.

EXAMPLE 2

Kureha KF-1100 resin was compression molded as above, and stretched at 90 degrees C. to 4.6 times its original length at a strain rate of 5 percent per minute. It was then allowed to relax in the stretched state at 120 degrees C. for 30 minutes, and then cooled to room temperature over a two-hour period. The film was then rolled and annealed as above.

For the purpose of comparison, uniaxially stretched films (herein referred to simply as stretched films) were prepared by the same stretching procedures described for the above Examples, then annealed in the stretched state at 120 degrees C. for 30 minutes.

Piezoelectric Measurements

The films prepared in the above Examples, as well as the stretched, unrolled films similarly prepared, were cleaned thoroughly with trichloroethane, rinsed in distilled water and metallized with 1000 Angstrom-thick layers of aluminum on both sides by vacuum deposition. Samples were poled at 90 degrees C. for one hour under a biased dc field in the range of 400 to 550 KV/cm, and cooled with the field on. The film was then annealed at 60 degrees C. for one hour under short-circuit conditions in order to more rapidly stabilize the film for measurement purposes.

Piezoelectric measurements were peformed at room temperature using a Rheovibron viscoelastometer to impose a sinusoidal elongational strain at 110 Hz. The poled film, typically about 5 cm × 0.5 cm × 60 microns in size, was held between two metallic grips, which were insulated from the metallized film using pieces of paper. Charge or current outputs were picked up from the two grip arms with thin copper wires (diameter 65 microns) attached to the arms with a silver paste, and monitored with a digital voltmeter afer being fed through a current amplifier (Keithly 427) and a lock-in amplifier (Princeton Applied Research PAR 124). Prior to poling, the stretched films had low $d_{13}$, compared to those subjected to the rolling and annealing treatments. The latter films displayed modest amounts of piezoelectricity ($d_{13}$ about 0.02 to 0.1 picocoulombs/Newton) depending on the number of passes through the rollers. The latter phenomenon is believed to be associated with charges generated from repeated contact of the polymer with the metal surface during rolling.

The results for the Kynar 821 of Example 1 at a poling field of 500 KV/cm show an increase in $d_{13}$ from an average of 16 picocoulombs/Newton (PC/N) for the stretched, unrolled film to an average of 20 PC/N for stretched, rolled, annealed film. The improvement is thus about 25 percent under these conditions. Omitting the annealing step yielded an increase of about 20 percent for the rolled film as compared to the unrolled film. The results of the Kureha KF-1100 films of Example 2 at a poling field of 500 KV/cm show an increase in $d_{13}$ from an average of 16 PC/N for the stretched, unrolled film to an average of 18 PC/N for stretched, rolled, annealed film. The improvement in this case was about 12 percent. When taking these measurements, an average over several unrolled samples was compared with an average over several different rolled samples. It was necessary to use different samples, as they had to be metallized or poling and $d_{13}$ measurement, making it not feasible to roll the same samples that had previously been measured for the unrolled case.

For both of the above Examples, a higher poling field generally yielded higher $d_{13}$ for both unrolled and rolled film, as would be expected. Furthermore, the greatest improvements in $d_{13}$ were obtained by rolling for approximately a 25 percent thickness reduction. A greater thickness reduction tended to result in the film breaking down in the poling field in many cases, although a thickness reduction up to 35 percent has been advantageously employed to increase $d_{13}$.

X-Ray Analysis

X-ray diffraction patterns were obtained using Ni-filtered $CuK_\alpha$ (1.542 Angstrom) radiation and a flat camera placed 5 cm away from the sample. Photographs were taken with the beam along the z direction as referred to the macroscopic sample (FIG. 2); with z being parallel to the stretching and rolling direction.

Figure 4:
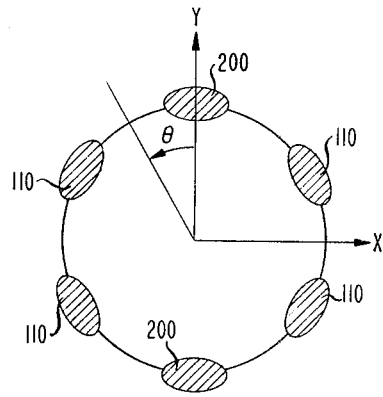
FIG. 4 shows schematically a wide-angle X-ray diffraction pattern with the X-ray beam along the z-axis for a PVDF film that has been stretched and rolled.

In FIGS. 3 and 4 are shown wide-angle X-ray diffraction patterns along the z axis for the Kynar 821 sample which had been stretched (FIG. 3), and then had been rolled (thickness reduction 25 percent) and annealed at 120 degrees C. for 30 minutes (FIG. 4). The patterns of FIGS. 3 and 4 schematically represent the 110 and 200 reflections, but other reflections (not shown) may also be present at other Bragg angles. The diffraction patterns of PVDF polymorphs have been well documented. It was evident from X-ray diffraction patterns obtained along the x and y axes (not shown) and the z axis that the stretched sample was predominantly of $\beta$ modification save for a small fraction of $\alpha$ form which diminished somewhat on rolling.

As seen from the z diffraction pattern in FIG. 4 the most pronounced effect of rolling and annealing is the preferential alignment of the crystals in the plane normal to the rolling (z) direction. The three pairs of arcs correspond to 110 and 200 reflections (of $\beta$-crystals) which have calculated structure factors, $|F(hkl)|^2$, in the ratio of 1.68 to one. Densitometric measurements of the peak intensities along the radial direction showed that each of the two inclined pairs had an integrated intensity about 45 percent greater than the one on the polar (y) axis; accordingly, the latter was identified with the 200 reflections. Thus the effect of rolling and annealing was to cause the crystals in the stretched film to rotate about their c axes, and, further, to align their polar b axes substantially towards the film surface (x direction) and their a axes towards the direction perpendicular to both the film normal and the stretching and rolling direction.

It is necessary that the film be stretched prior to rolling, even though rolling itself is known to convert some proportion of the $\alpha$-type to the $\beta$-type structure. This was confirmed by X-ray analysis of a Kynar 821 film that had been rolled to achieve a 50 percent thickness reduction without prior stretching. A z-axis pattern of the type shown in FIG. 3 resulted, showing that the b axes were substantially randomly oriented. Thus, the sequence of stretching followed by rolling is part of the inventive teaching.

Although the orientation patterns in FIG. 4 resulted from the combined effect of rolling and annealing a stretched film, the annealing step was not essential for obtaining the oriented structure in the sample. Examination of X-ray photographs taken at different stages of rolling prior to the annealing treatment showed that the sample began to exhibit a distinct orientation pattern in the x-y plane as it thinned down by about 20 percent. Upon further rolling, the crystal alignment improved progressively; however, crack lines began to develop along the rolling direction as the thickness reduction exceeded about 35 percent.

Annealing the stretched and rolled sample improved the crystal orientation along the three macroscopic axes (x, y, z) and, as a result, distinct orientation patterns were obtained even in films with a thickness reduction of about 15 percent. Treating the sample at higher temperatures (e.g., at 160 degrees C. for 5 minutes) resulted in a more rapid improvement of the crystal orientation; however, prolonged heating at elevated temperatures (e.g., at 160 degrees C. for 10 minutes) caused recrystallization in the $\alpha$ form as indicated by the appearance of additional reflection rings in the X-ray patterns. Annealing can be accomplished at temperatures as low as 70 degrees C., although the time required will be on the order of several hours.

Figure 5:
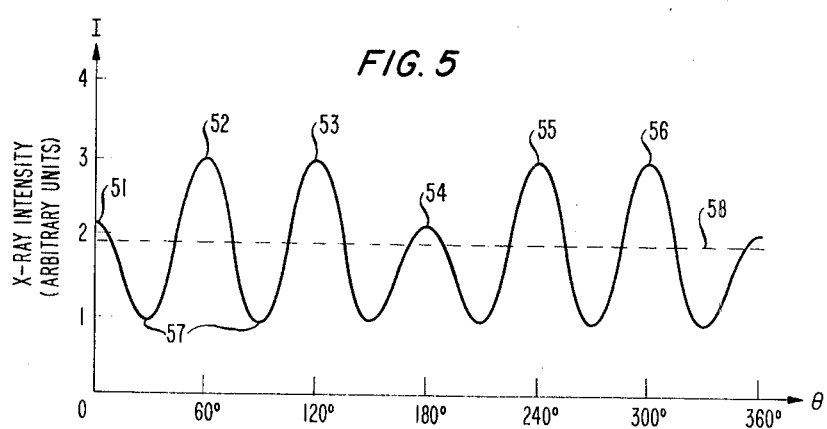
FIG. 5 shows a plot of intensity of the 200 and 110 reflections (as in FIG. 4) as a function of azimuthal angle for rolled and nonrolled PVDF films.

To give a quantitative value to the degree of crystal orientation, a plot of the X-ray intensity for the diffraction pattern was made; see FIG. 5. This plot is shown schematically, with the shape of the curve being only a rough approximation to the actual intensities. However, the numerical values of the maxima and minima are representative of typical relative values. The small maxima 51, 54 correspond to the 200 reflection plane, and the large maxima 52, 53, 55, 56 correspond to the 110 reflection plane. The minima 57 between these maxima have approximately the same values, arbitrarily assigned as 1 herein. It should be noted that the six maxima occur at approximately equal 60 degree increments of angle $\theta$, and occur at a Bragg angle of approximately 10.4 degrees.

This plot shows that a typical ratio of the maximum intensity of a 110 reflection to the maximum intensity of a 200 reflection is approximately 1.45. The fact that the 110 intensity is greater than the 200 intensity in this configuration shows that the b crystal axes are pointing substantially normally to the film surface. For comparison, an unrolled film otherwise prepared as in Example 1 was measured in a similar manner, with its intensity at a Bragg angle of 10.4 degree being essentially constant, as shown by dotted line 58. This corresponds to the diffraction pattern of FIG. 3, and shows that the 110 and 200 planes are substantially randomly oriented with respect to the film surface. Hence, the b axes are substantially randomly oriented with respect to the film surface for unrolled films. It is further believed that the inventive procedure is the only known means to obtain a diffraction pattern having any discernible orientation of the 110 and 200 planes in the manner shown in FIG. 4. It should be further noted that the thickness of the film must be sufficient to allow a z-axis diffraction pattern to be made, with a thickness of 0.2 mm being typical for convenient X-ray analysis. To this end, it may be necessary to stack films that are much thinner than this to obtain a sufficient thickness. For purposes of X-ray analysis, the term "film" thus includes stacked films. The stacked films must be oriented so that the z (stretch) axes are parallel. This can readily be determined, as the easy-tear axis of a stretched, or stretched and rolled film is coincident with the stretch axis.

I claim:

1. A method of making a polyvinylidene fluoride film by steps comprising uniaxially stretching a polyvinylidene fluoride film having a predominantly α-type crystal structure to form a polyvinylidene fluoride film having a predominantly β-type crystal structure, and poling the film in an electric field, the invention characterized by the further steps comprising passing the stretched film one or more times along the stretch direction through rolling means so as to reduce the thickness of the film prior to said poling.

2. A method of making a polyvinylidene fluoride film according to the method of claim 1, further characterized in that said rolling reduces the thickness of the film at least 15 percent below its thickness prior to rolling.

3. A method of making polyvinylidene fluoride film according to the method of claims 1 or 2, further characterized by steps comprising annealing the film after the rolling step and prior to the poling step by heating said film to a temperature of at least 70 degrees C.

4. The method of claims 1 or 2 further characterized in that the ratio of the stretched length to the unstretched length of said film prior to rolling is at least 3.

5. The method of claims 1 or 2 further characterized by steps comprising maintaining the film in the stretched state at an elevated temperature for a period of time prior to said rolling.

6. The method of claims 1 or 2 further characterized in that an X-ray diffraction pattern of said film after said rolling, produced by 1.542 Angstrom radiation directed along the easy-tear axis of the film, comprises six substantially equally spaced diffraction spots at a Bragg angle of approximately 10.4 degrees, said spots corresponding to 110 and 200 reflections.

7. The method of claim 6 further characterized in that the ratio of the maximum X-ray intensity of at least one of said 110 reflections to the maximum intensity of at least one of said 200 reflections is at least 1.1.

8. The method of claim 6 further characterized in that the ratio of the maximum X-ray intensity of at least one of said 110 reflections to the maximum intensity of at least one of said 200 reflections is at least 1.4.

9. A polyvinylidene fluoride film produced according to the method of claim 1.

* * * * *